United States Patent [19]

Gedridge, Jr.

[11] Patent Number: 5,275,966
[45] Date of Patent: Jan. 4, 1994

[54] LOW TEMPERATURE PROCESS FOR PRODUCING ANTIMONY-CONTAINING SEMICONDUCTOR MATERIALS

[75] Inventor: Robert W. Gedridge, Jr., Ridgecrest, Calif.

[73] Assignee: The United States of America as represented by the Secretary of the Navy, Washington, D.C.

[21] Appl. No.: 729,742

[22] Filed: Jul. 8, 1991

[51] Int. Cl.$^5$ .................. H01L 21/20; H01L 21/36
[52] U.S. Cl. ................................. 437/81; 437/104; 437/107; 437/971; 148/DIG. 5; 148/DIG. 110
[58] Field of Search .............. 437/81, 104, 107, 133, 437/971; 156/606, 614; 148/DIG. 5; DIG. 110; DIG. 65

[56] References Cited

U.S. PATENT DOCUMENTS 5,104,825  4/1992  Takikawa ............... 148/DIG. 5

FOREIGN PATENT DOCUMENTS 204733  8/1988  Japan .

OTHER PUBLICATIONS

Stringfellow; "Organometallic Vapor Phase Epitaxy: Theory and Practice"; Academic Press (1989); pp. 15–53.

Stauf et al "Low Temperature Organometallic Vapor Phase Epitaxy of InSb Using the Novel Sb Precursor Triisopropylantimony" *App. Phys. Lett.*, 58 (12) 25 Mar. 1991.

Chen et al "Triisopropylantimony for Organometallic Vapor Phase Epitaxial Growth of GaSb and InSb", *App. Phys. Lett.* 58(22) 3 Jun. 1991.

Hoke et al "Metalorganic Growth of CdTe and HgCdTe Epitaxial Films at a Reduced Substrate Temperature Using Diisopropyltelluride" *App. Phys. Lett.*, 46, (4) 15 Feb. 1985.

Chen et al, *J. App. Phys.* vol. 69, No. 11, pp. 7605–7611, 1 Jun. 1991.

*Primary Examiner*—Brian E. Hearn
*Assistant Examiner*—Trung Dang
*Attorney, Agent, or Firm*—Stuart H. Nissim; Melvin J. Sliwka; John L. Forrest, Jr.

[57] ABSTRACT

Tri-isopropylantimony is used as a source of antimony in chemical vapor deposition production of semiconductor materials. The process can be used to introduce antimony as a dopant into III/V and II/VI semiconductor materials.

12 Claims, 1 Drawing Sheet

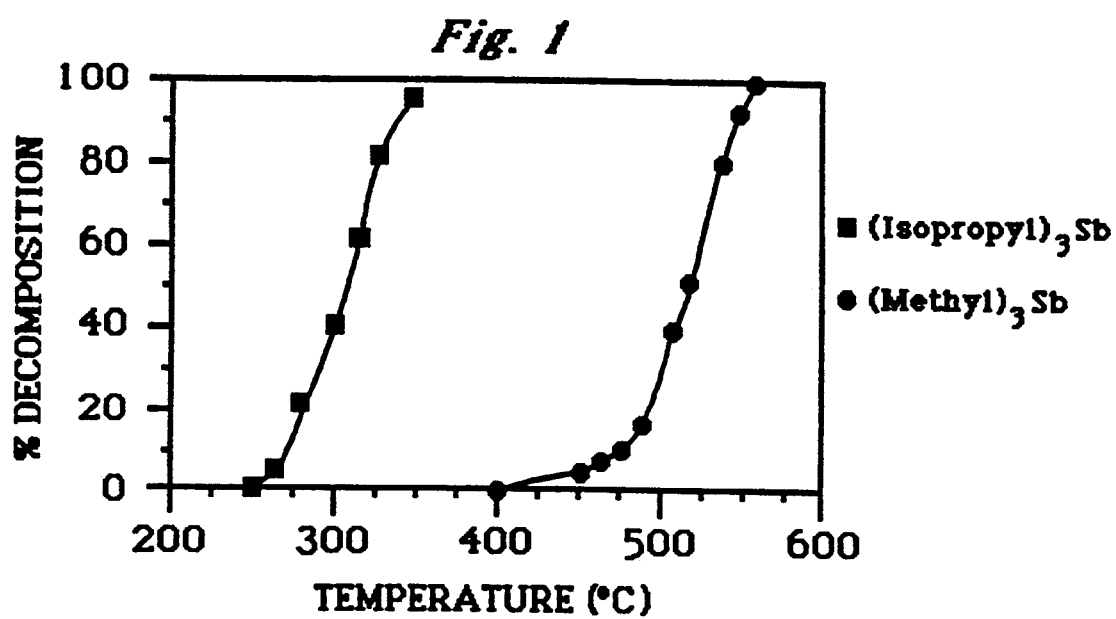

LOW TEMPERATURE PROCESS FOR PRODUCING ANTIMONY-CONTAINING SEMICONDUCTOR MATERIALS

BACKGROUND OF THE INVENTION

The present invention relates in general to the production of semiconductor materials, and more particularly, to an efficient, low temperature process of using chemical vapor deposition to produce antimony-containing semiconductor materials.

THE RELATED ART

The III/V antimony-containing semiconductor materials have military and commercial applications in infrared (IR) detection for seeker, night vision and surveillance devices as well as optical fiber communication systems. A variety of binary, ternary and quaternary III/V semiconductor systems containing antimony have been investigated for applications in infrared emitters and detectors operating in the 3-5 $\mu$m and 8-12 $\mu$m spectral ranges. These wavelength ranges are important since they are natural windows in the atmosphere for IR transmission.

Binary materials such as InSb and GaSb have been grown heteroepitaxially by organometallic vapor phase epitaxy (OMVPE) and metal-organic magnetron sputtering. Ternary materials such as $Ga_{1-x}Al_xSb$, $Ga_{1-x}As_xSb$, and $Ga_{1-x}In_xSb$ have been grown by OMVPE. Molecular beam epitaxy has been used to grow $GaAs_{1-x}Sb_x$ for lasers and photoconductive detectors. InAsSb/InSb strained layer superlattice IR detectors have also been reported.

OMVPE is a high throughput technique for the production of high quality III/V and II/VI semiconductor materials and complex structures (superlattices and focal plane arrays) from organometallic precursors. This technique has been used to produce metastable materials such as GaInAsSb, GaPSb, InPSb, and GaAsSb.

The ternary alloy $InAs_{1-x}Sb_x$ has the smallest band gap (x=0.6, $E_g$=O.1eV at 300 K) of any of the III/IV semiconductor materials and this has attracted interest for infrared detection in the 8-12 $\mu$m spectral range. $InAs_{1-x}Sb_x$ has also been grown by OMVPE. The cutoff wavelength at 77 K for $InAs_{1-x}Sb_x$ (x=0.6) is ~9 $\mu$m. Further reduction of the band gap is required to extend the cutoff wavelength and can occur if the crystal lattice is dilated with the heavier Group V element bismuth (Bi). Although Bi-containing semiconductor materials are metastable, the OMVPE technique can be used to produce these metastable materials. Reduction in the band gap is expected in the $InAs_{1-x-y}Sb_yBi_x$ material with a cutoff wavelength in the 8-14 $\mu$m spectral range. This expansion of the IR detector range could have a significant impact on IR detector performance.

Epitaxial Sb-based III/V semiconductors have potential applications in long wavelength detectors and high speed devices. However, to fully develop such devices, it is necessary to minimize the incorporation of unintentional impurities. To date, molecular beam epitaxy of InSb on GaAs has produced layers with mobilities of about 150,000 $cm^2$/V-sec(77° K.). Organometallic vapor phase epitaxy (OMVPE) layers of InSb on GaAs have mobilities of only about 5,000 $cm^2$/V-sec at the same temperature, approaching 70,000 $cm^2$/V-sec when grown on InSb substrates. One possible cause for this degraded performance is the incorporation of carbon impurities, inherent to the growth kinetics of these films when organometallic Sb sources, typically trimethylantimony (TMSb), are used with trimethylindium (TMIn).

Both $InAs_{1-x-y}Sb_yBi_x$ and $InSb_{1-x}Bi_x$ have been grown by OMVPE using trimethylantimony (($CH_3)_3Sb$) as the organo-antimony source compound. Bismuth concentrations higher than 2 atom %, as well as growth temperatures above 400° C., resulted in poor film morphology during the growth of $InAs_{1-x-y}Sb_yBi_x$ and $InAs_{1-x}Bi_x$. Lower growth temperatures, <400° C., resulted in significant problems due to the incomplete pyrolysis of trimethylantimony; trimethylantimony is only 15% pyrolyzed at 400° C. Therefore, trimethylantimony is not a very efficient Sb-source compound when film growth temperatures are below 400° C.

In order to minimize the tendency of the Bi to phase separate and to limit the diffusion in these alloys by lowering the film growth temperature, alternative organo-antimony precursors for chemical vapor deposition are needed which have lower pyrolysis temperatures than trimethylantimony. It is also important that an alternative organo-antimony precursor pyrolyzes with minimal unintentional impurity incorporation. Organometallic precursors with methyl groups are known to incorporate carbon impurities due to the pyrolysis mechanisms involving methyl radicals.

Group V hydrides such as $AsH_3$ and $PH_3$ are commonly used with Group III trialkyls ($R_3M$; M=Al,Ga,In; R=Me,Et) in the growth of III/V semiconductors. Problems associated with toxicity and high temperatures required for the pyrolysis of these Group V hydrides have resulted in the development of alternative non-hydride Group V source compounds for chemical vapor deposition.

In contrast, trimethylantimony or triethylantimony are the conventional Sb source compounds although $GaAs_{1-x}Sb_x$, has been grown using $SbH_3$. However, $SbH_3$, is unstable, inconvenient, and not commercially available.

The availability of alternative Sb source compounds with lower pyrolysis temperatures for chemical vapor deposition could greatly enhance the development of this class of IR detector materials. Development of new Sb source compounds for chemical vapor deposition is of interest for lowering the film-growth temperature and altering the chemistry to minimize carbon incorporation.

SUMMARY OF THE INVENTION

An improved process is provided for forming antimony-containing semiconductors using chemical vapor deposition. In the process tri-isopropylantimony is used as the source of antimony. The process can be used in forming III/V antimony-containing semiconductors. The process can also be used to introduce antimony as a dopant in III/V and II/VI semiconductor materials.

BRIEF DESCRIPTION OF THE DRAWING

FIG. 1 illustrates the percent decomposition versus the temperature of both $(Isopropyl)_3Sb$ and $(Methyl)_3Sb$.

DETAILED DESCRIPTION OF THE INVENTION

It has been unexpectedly discovered that tri-isopropylantimony $((CH_3)_2CH)_3Sb$ can be used as a low temperature, alternative precursor in the chemical vapor deposition growth of antimony-containing semiconductor materials and could also be used as a dopant in III/V and II/VI semiconductor materials such as, but not limited to, GaAs and HgCdTe, respectively.

The decomposition of tri-isopropylantimony was studied in a flow tube apparatus, using $D_2$ and He as carrier gases. It was unexpectedly discovered that tri-isopropylantimony begins to decompose above 250° C. in $D_2$ or He by a free-radical mechanism. It was also found that tri-isopropylantimony is completely decomposed at 340° C. Thus, the decomposition of tri-isopropylantimony occurs at about 125° C. lower than trimethylantimony decomposition in $D_2$. See FIG. 1.

While trimethylantimony decomposition temperature is very dependent upon the ambient gas, tri-isopropylantimony decomposition is unaffected by the ambient gases $D_2$ and He. The pyrolsis of tri-isopropylantimony resulted in metallic films in the reactor with minimal carbonaceous deposits. Lower decomposition temperature is a significant improvement over the use of trimethylantimony.

The lower decomposition temperature of tri-isopropylantimony in comparison to trimethylantimony not only permits lower growth temperatures, but also provides a source compound whose pyrolysis is significantly more efficient at higher growth temperatures. Use of tri-isopropylantimony may also minimize carbon incorporation into the semiconductor materials, in comparison to trimethylantimony, since methyl radicals do not originate from tri-isopropylantimony.

By using the improved process of the present invention, long wavelength infrared detector materials can be produced. The infrared materials made with materials produced according to the present invention will find use in seekers and surveillance devices. The process of the present invention lowers the production costs and/or improves the performance of infrared detector materials used in both civilian and military applications.

Without any further elaboration, it is believed that one skilled in the art can, using the preceding description, utilize the present invention to its fullest extent. The following preferred specific embodiments are, therefore, to be construed as merely illustrative and not limitive of the remainder of the disclosure in any way whatsoever.

In the foregoing and in the following examples, all temperatures are set forth uncorrected in degrees Celsius; and unless otherwise indicated all parts are in grams.

EXAMPLES

EXAMPLE 1

Tri-isopropylantimony, $((CH_3)_2CH)_3Sb$, was prepared by reaction of $SbCl_3$ with slightly more than three equivalents of isopropyl magnesium chloride. To a solution of 45.6 g (200 mmol) of $SbCl_3$ in 100 ml of dry de-oxygenated tetrahydrofuran at −78° C. was added dropwise 300 ml, (2.0M THF, 660 mmol) of isopropyl magnesium chloride. The resultant slurry was mechanically stirred for 24 hours. Then 150 ml of freeze-thaw degassed distilled water was added at 0° C. with stirring. Hexane was added (50 ml.) and the organic layer was cannulated onto anhydrous $MgSO_4$. The aqueous layer was extracted with an additional 300 ml. of hexane and the combined organic extracts were stirred for 24 hours with $MgSO_4$.

The slurry was filtered and the solvents were removed by vacuum distillation. Tri-isopropylantimony was collected at 55°–58° C. at 4 torr as a colorless liquid (44.3 g, 88% yield based on $SbCl_3$).

Tri-isopropylantimony was purified by fractional vacuum distillation two more times and characterized by $^1H$ and $^{13}C$ NMR spectroscopy.

EXAMPLE 2

The decomposition of tri-isopropylantimony at various temperatures was studied in a pyrolysis flow tube apparatus, using $D_2$ and He as carrier gases. The carrier gases passed through mass flow controllers, then through stainless steel bubblers containing the reactants. The gas mixture entered the reactor, which was comprised of a quartz tube of 4 mm ID and a hot zone 41.5 cm long. The exhaust gases were sampled continuously via a variable leak connected to a time-of-flight mass spectrometer. The same procedure was employed to ascertain the decomposition of trivinylantimony and trimethylantimony. The results of these studies are illustrated in FIG. 1. From the decomposition data, it was found that these organoantimony precursors pyrolyze by gas phase homolytic fission of the Sb-C bonds to form free-radicals. The activation energies (kcal/mol) of trivinylantimony (49.0) and tri-isopropylantimony (30.8) are lower than that of trimethylantimony (55.9). The decomposition temperatures of tri-isopropylantimony were independent upon the use of $D_2$ or He, while trivinylantimony and trimethylantimony decomposition temperatures were carrier gas dependent.

EXAMPLE 3

InSb epilayers were grown using organometallic vapor phase epitaxy on GaAs and InSb substrates. The substrates were degreased with low particle density soap and organic solvents. The GaAs and InSb substrates were etched for 5 minutes with $H_2SO_4:H_2O_2:H_2O$ (5:1:1:) and $CH_3CHOHCOOH:HNO_3:HF$ (50:8:2), respectively, and blown dry with high-purity $N_2$ before loading into the reactor. Deposition temperatures ranged from 300° C. to 450° C. The substrates were heated to growth temperature and deposition was initiated. The vertical reactor used was comprised of an RF heated rotating 2 inch graphite susceptor inside a 3 inch nominal i.d. quartz tube operated at atmospheric pressure. The trimethylindium (TMIn) and tri-isopropylantimony (TIPSb) bubblers were kept at 17.0° and 16.5° C., yielding vapor pressures of 1 and 0.3 Torr, respectively. The push gas was palladium-diffused hydrogen and total gas flow through the reactor was 4 standard liters per minute, with individual bubbler flows in the range of 6-20 standard cm³ per minute for TMIn and 800 standard cm³ per minute for TIPSb.

The films were characterized by variable temperature van der Pauw Hall, double-crystal x-ray diffractometry, Auger electron spectroscopy, scanning electron and Nomarski microscopy. The results are exemplified in Table 1 below.

TABLE 1

Summary of n-type carrier concentrations and mobilities for InSb epilayers grown using tri-isopropyl antimony as a function of Growth temperature, V/III Ratio, thickness, and substrate. The p-type InSb substrates are intrinsically conducting at 295K and hence transport data cannot be reliably extracted.

| Growth temperature (°C.) | V/III ratio | Thickness ($\mu$) | Substrate | 295K | | 77K | |
|---|---|---|---|---|---|---|---|
| | | | | mobility ($cm^2/V\,s$) | concentration ($\times 10^{16}\,cm^{-3}$) | mobility ($cm^2/V\,s$) | concentration ($\times 10^{16}\,cm^{-3}$) |
| 400 | 5.0 | 1.0 | GaAs | 6 100 | 22 | 5 100 | 21 |
| 375 | 12.0 | 1.1 | GaAs | 11 100 | 4.5 | 9 300 | 3.4 |
| 350 | 13.0 | 1.0 | GaAs | 24 400 | 2.9 | 20 000 | 1.8 |
| 325 | 20.0 | 0.6 | GaAs | 8 800 | 20 | 8 000 | 18 |
| 300 | 40.0 | 0.5 | GaAs | 2 000 | 12 | 1 600 | 11 |
| 350 | 13.0 | 1.2 | InSb | N/A | N/A | 63 200 | 3.7 |
| 325 | 42.0 | 1.0 | InSb | N/A | N/A | 28 900 | 7.4 |

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process of providing an antimony-containing semiconductor material over a substrate, comprises the steps of:
   directing a flow of one or more source compounds toward the substrate: and,
   depositing from said directed flow said semiconductor material over the substrate; wherein,
   tri-isopropylantimony is used as a source compound of antimony.

2. The process of claim 1, wherein the process is carried out at temperatures of about 250° C. and above.

3. The process of claim 1, wherein the process uses only tri-isopropylantimony to produce the antimony.

4. The process of claim 1, wherein the process is used in producing binary semiconductor systems.

5. The process of claim 1, wherein the process is used in producing ternary semiconductor systems.

6. The process of claim 1, wherein the process is used in producing quaternary semiconductor systems.

7. The process of claim 1, wherein the process is carried out at temperatures below 400° C.

8. The process of claim 1, wherein tri-isopropylantimony is used to provide a dopant of antimony in a semiconductor material.

9. The process of claim 8, whereupon said semiconductor material is a III/V semiconductor material.

10. The process of claim 8, wherein said semiconductor material is a II/VI semiconductor material.

11. The process of claim 1, wherein the temperature of the process is sufficiently high to at least partially decompose the tri-isopropylantimony, thereby producing a semiconductor material without substantial amounts of carbon deposits.

12. A semiconductor system produced by the process of claim 1.

* * * * *